(12) United States Patent
Mo et al.

(10) Patent No.: US 8,324,548 B2
(45) Date of Patent: Dec. 4, 2012

(54) IMAGING DEVICES AND METHODS FOR CHARGE TRANSFER

(75) Inventors: Yaowu Mo, San Jose, CA (US); Chen Xu, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 435 days.

(21) Appl. No.: 12/412,120

(22) Filed: Mar. 26, 2009

(65) Prior Publication Data

US 2010/0243866 A1   Sep. 30, 2010

(51) Int. Cl.
*H01J 40/14* (2006.01)
(52) U.S. Cl. ............. 250/208.1; 250/214 R; 250/214 A; 348/300; 348/308
(58) Field of Classification Search ............... 250/208.1, 250/214 R, 214 A; 348/300–302, 308
See application file for complete search history.

(56) References Cited

U.S. PATENT DOCUMENTS

| | | | |
|---|---|---|---|
| 4,786,818 A | 11/1988 | Mead et al. | |
| 6,664,530 B2 | 12/2003 | Simony | |
| 6,768,515 B1 | 7/2004 | Erten et al. | |
| 7,005,628 B2 | 2/2006 | Rossi | |
| 7,183,555 B2 | 2/2007 | Jarron | |
| 2005/0024512 A1 | 2/2005 | Moini et al. | |
| 2005/0218299 A1* | 10/2005 | Olsen et al. | 250/214 A |
| 2006/0256221 A1* | 11/2006 | Mckee et al. | 348/308 |
| 2007/0153337 A1* | 7/2007 | Kim | 358/482 |
| 2008/0265952 A1* | 10/2008 | Rincon-Mora et al. | 327/111 |
| 2008/0291309 A1 | 11/2008 | Gruev et al. | |

* cited by examiner

*Primary Examiner* — Kevin Pyo
(74) *Attorney, Agent, or Firm* — Nancy Ru; Kendall P. Woodruff

(57) ABSTRACT

A pixel circuit having improved charge transfer including an amplifier having an input node electrically connected to a charge storage node of the pixel circuit, and a negative feedback control loop having a capacitance element electrically connected between the input node and an output node of said amplifier.

27 Claims, 11 Drawing Sheets

IMAGING DEVICES AND METHODS FOR CHARGE TRANSFER

FIELD OF THE INVENTION

Embodiments described herein relate generally to imaging devices, and more particularly to imaging devices and methods of operating imaging devices with improved charge transfer.

BACKGROUND OF THE INVENTION

Many portable electronic devices such as cameras, cellular telephones, personal digital assistants (PDAs), MP3 players, computers and other devices include an imager for capturing images. One example of an imager is a complementary metal-oxide semiconductor ("CMOS") imager. A CMOS imager includes a focal plane array of pixels, each one of the pixels including at least one photosensor overlying a substrate for accumulating photo-generated charge in the underlying portion of the substrate. Each pixel may include at least one electronic device such as a transistor for transferring charge from the photosensor to a storage region.

Typically, each pixel has corresponding readout circuitry that includes at least a charge storage node connected to the gate of the output transistor, such as an output source follower transistor, a reset transistor for resetting the charge storage node to a predetermined charge level, and a row control transistor for selectively connecting the readout circuitry to an output column line. The charge storage node may be constructed as a floating diffusion node. Each pixel may have independent readout circuitry, or may employ common element pixel architecture (CEPA), that may include multiple pixels sharing a single set of readout circuitry.

A pixel (including a photosensor), and its corresponding readout circuitry, are herein collectively referred to as a "pixel circuit." In a typical CMOS imager, the active elements of a pixel circuit perform the necessary functions of: (1) photon to charge conversion; (2) accumulation of image charge; (3) resetting the storage region to a known state; (4) transfer of charge to the storage region accompanied by charge amplification; (5) selection of a pixel circuit for readout; and (6) output and amplification of a signal representing a reset level and pixel charge. Photo charge may be amplified when the charge moves from the initial charge accumulation region to the storage region. The charge at the storage region is typically converted to a pixel output voltage by a source follower output transistor.

FIG. 1 illustrates a typical four-transistor (4T) pixel circuit 100 utilized in a pixel array of an imager, such as a CMOS imager. Pixel circuit 100 includes a pixel having a photosensor 102 (e.g., a photodiode, pinned photodiode, photogate, or photoconductor) and a transfer transistor 104. Pixel circuit 100 also includes readout circuitry, including a charge storage region configured as a floating diffusion node 110, a reset transistor 106, a source follower transistor 108, and a row select transistor 112. Photosensor 102 is connected to floating diffusion node 110 by the transfer transistor 104 when transfer transistor 104 is activated by a transfer control signal TX. Reset transistor 106 is connected between floating diffusion node 110 and an array pixel supply voltage $V_{BIAS}$. A reset control signal RST is used to activate reset transistor 106, which resets floating diffusion node 110 to a predetermined reset voltage corresponding to the array pixel supply voltage $V_{BIAS}$, as is known in the art.

Source follower transistor 108 has its gate connected to floating diffusion node 110 and is connected between array pixel supply voltage $V_{BIAS}$ and row select transistor 112. Source follower transistor 108 converts the charge stored at floating diffusion node 110 into an electrical output signal. Row select transistor 112 is controllable by a row select signal RS for selectively outputting an output signal from source follower transistor 108 onto an output column line 114. In a CMOS imager, two output signals are conventionally generated for each pixel circuit; one being a reset signal $V_{RST}$ generated after the floating diffusion node 110 is reset, the other being an image or photo signal $V_{OUT}$ generated after charges are transferred from photosensor 102 to floating diffusion node 110. This process is commonly referred to as "correlated double sampling" or "CDS". Output signals $V_{RST}$, $V_{OUT}$ are selectively stored in a sample and hold circuit (not shown).

There is demand for scaled-down pixel sizes, and thus floating diffusion nodes with lower charge storage capacity are being seen. Conventional pixel circuits, however, suffer from an intrinsic limitation due to a trade-off between full-well charge capacity and image lag. The full-well charge capacity of a pixel is a maximum number of electrons that can be generated and stored in a photosensor. When the number of generated electrons reaches the full-well charge capacity, a photosensor is saturated and is unable to further respond to incident photons. Thus, photosensors with higher full-well charge capacity are typically desirable.

Lower capacity floating diffusion nodes, however, can limit the capability of achieving an accurate signal corresponding to a charge near the full-well charge capacity of the photosensor. For example, when the full-well capacity of a photosensor is larger than the charge holding capacity of the corresponding floating diffusion node, there is charge sharing during charge transfer between the photosensor and the floating diffusion node, which can cause image lag. While the full-well charge capacity of the photosensor, or the amount of charge transferred to the floating diffusion node, may be limited, such as through an anti-blooming transistor, this limits the overall dynamic range of the pixel.

Typically, as full-well capacity of a photosensor in a pixel circuit is increased, image lag is also likely to increase. This is due to conventional pixel circuit's reliance on perfect charge transfer (e.g., via a transfer transistor) from a photosensor to a floating diffusion region. FIGS. 2A-2C depict an exemplary charge transfer operation between a photosensor 202 and a floating diffusion node 210 of a typical 4T CMOS pixel circuit, such as pixel circuit 100 (FIG. 1). The full-well charge capacity of the pixel is illustrated by shaded area 220. In a pixel where photosensor 202 is a pinned photodiode, this area 220 is determined approximately by the pinned potential $V_{PIN}$ of photodiode 202 and the photodiode capacity $C_{PD}$. Typically during the light integration period, the charge generated in pinned photodiode 202 is blocked from being transferred to a floating diffusion node 210 by a transfer transistor 204 (e.g., transfer transistor 104 of pixel circuit 100 in FIG. 1) being in an "OFF" state.

The ability to store electrons in floating diffusion node 210 (i.e., when the electrons from photosensor 202 are transferred to floating diffusion node 210 across transfer transistor 204) is determined by the charge holding capacity of the floating diffusion node 210. As shown in FIG. 2B, when the full-well capacity 220 of photosensor 202 is larger than the charge holding capacity of the floating diffusion node 210, there is charge sharing between the photosensor 202 and floating diffusion node 210 when transfer transistor 204 is turned "ON". In this case, when transfer transistor 204 goes back to the "OFF" state (as shown in FIG. 2C), photosensor 202 will retain signal charge which mixes with generated signal charge of the next frame, causing image lag.

As the full-well charge capacity is increased, for example by increasing pinned potential $V_{PIN}$ of pinned photodiode 202, lag increases, and fixed pattern noise of the pixel is increased, particularly at low lighting levels. Thus, there is need for a pixel circuit with adequate full-well charge capacity, yet with reduced negative effects of lag and fixed pattern noise.

Furthermore, it may be desirable for multiple pixels to use common output circuitry elements in a pixel circuit, such as a common floating diffusion node. An example of multiple pixels in a pixel circuit sharing a common floating diffusion node and readout circuitry is disclosed in U.S. Published Patent Application No. 2006-0256221 A1, filed on May 11, 2005, and assigned to Micron Technology, Inc., the entire disclosure of which is hereby incorporated by reference. Multiple pixels sharing a common floating diffusion node increase the fill factor of a pixel array, and also enable operations such as summing of pixel signals from multiple pixels. Pixel-sharing operations on the same floating diffusion node in a conventional pixel circuit require that the floating diffusion node have an adequate capacity to store charge from all pixels. Further, operations such as pixel summing require a floating diffusion node capacity sufficient to accommodate summed charge from multiple pixels. Operations such as pixel summing, when performed on a pixel circuit with inadequate floating diffusion node capacitance, can degrade the conversion gain of the pixel circuit. Thus, there is a need for a pixel circuit configuration where the conversion gain is not limited by the capacity of the shared floating diffusion node.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the claimed invention.

Various embodiments are described below that include a pixel circuit with an amplifier and a negative feedback control loop having a capacitance element. During an amplification phase, the capacitance element and a capacitance of a photosensor in a corresponding pixel create a capacitance divider, thus fixing the voltage of a charge storage node and creating a net current due to the difference between the potentials of the photosensor and the charge storage node. This net current is amplified and integrated at the capacitance element, and output as the signal voltage. Pixel circuits, imagers, imager systems, and methods of operating thereof, in accordance with embodiments described herein, provide for photosensors with increased full-well charge capacity, yet with potentially reduced negative effects of lag and fixed pattern noise, because the transfer transistor can be configured to act merely as a switch, and operation may not dependent upon storage region capacitance. Described embodiments can provide high conversion gain that may not be limited by the storage node capacitance, as well as low readout and reset noise. Embodiments also provide for convenient sharing of common output circuitry by multiple pixels, which may not be limited by storage region capacitance.

Figure 1:
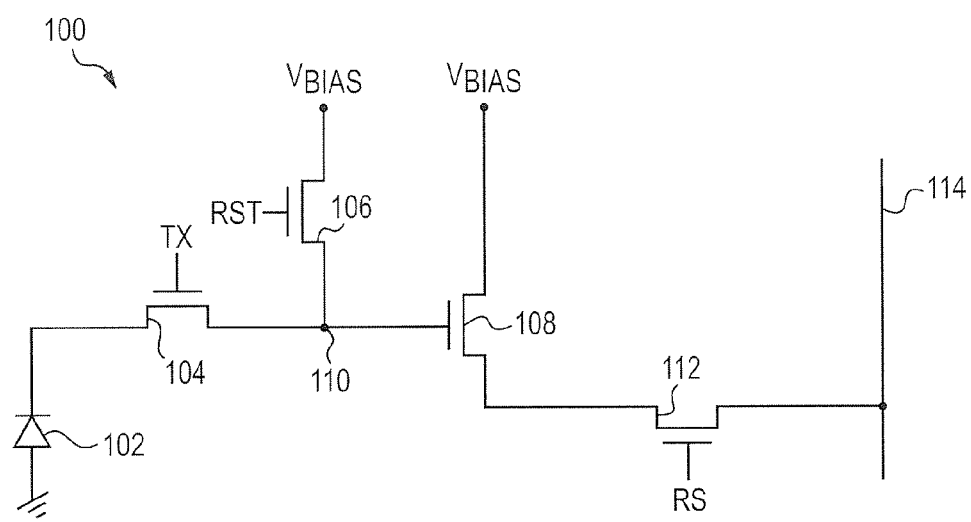
FIG. 1 shows a conventional 4T pixel circuit.
Figure 2A:
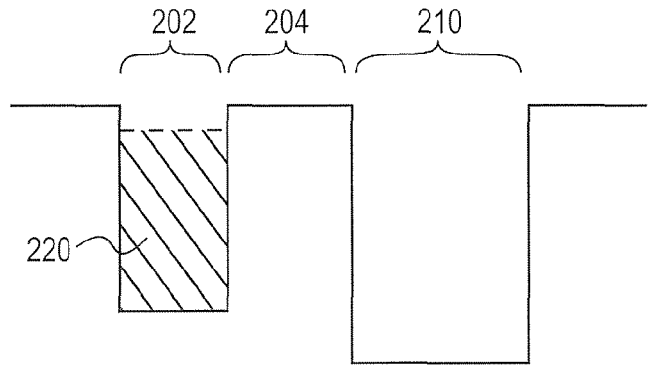
FIGS. 2A-2C show an exemplary charge transfer operation of a typical pixel circuit.
Figure 2B:
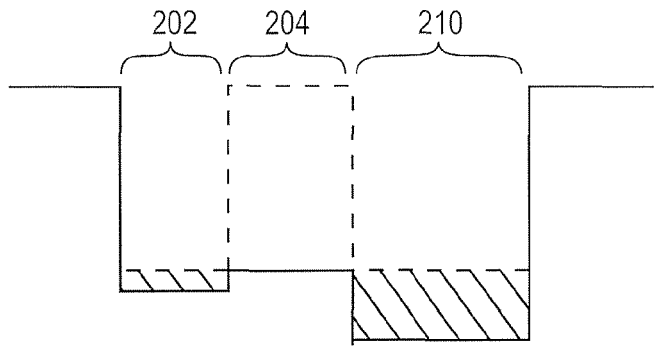
Figure 2C:
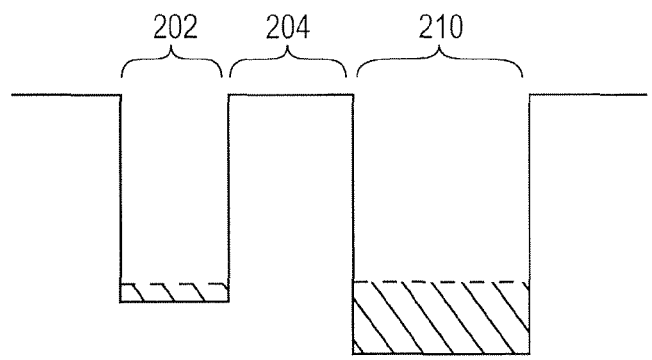
Figure 3A:
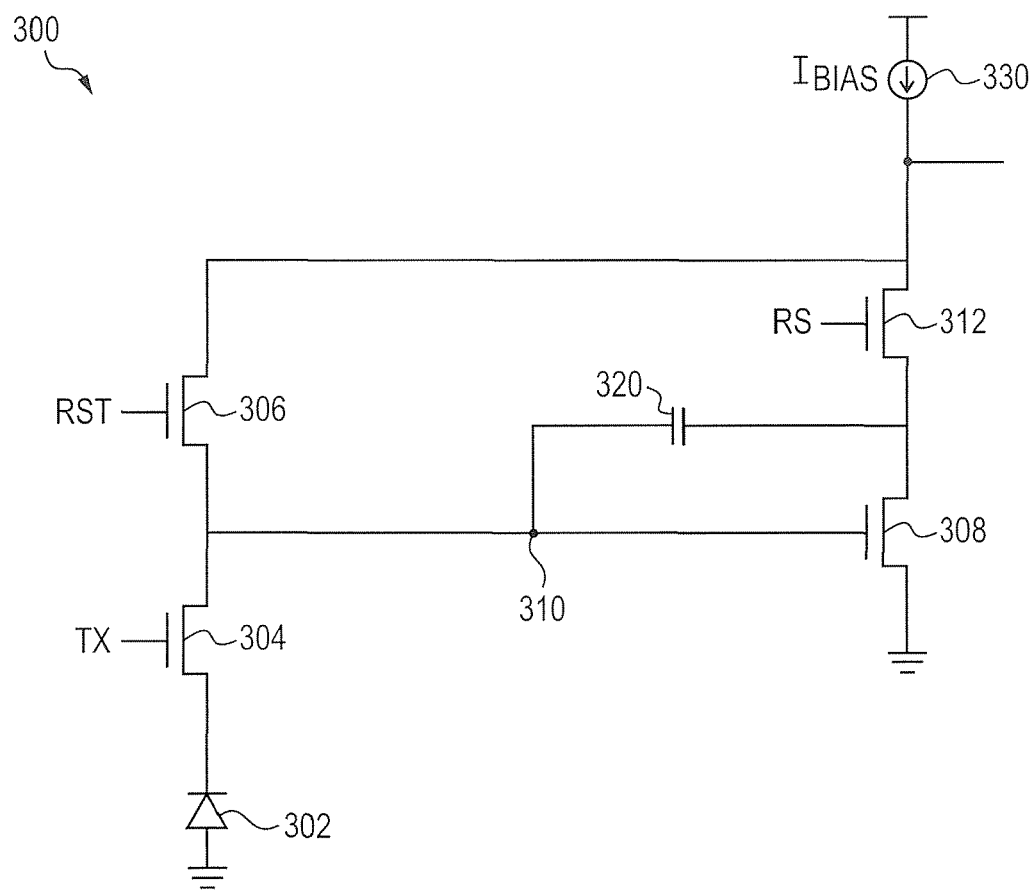
FIG. 3A shows a first embodiment of a pixel circuit with a negative feedback control loop, in accordance with embodiments described herein.

FIG. 3A illustrates an example embodiment of a pixel circuit 300 with a negative feedback control loop. The negative feedback control loop of pixel circuit 300 is achieved by using an amplifier, in this case, a common-source amplifier formed by amplifier transistor 308 and ground, and a feedback loop electrically connecting the gate and drain of amplifier transistor 308. The common-source amplifier formed by amplifier transistor 308 and ground is biased via a bias current $I_{BIAS}$ 330. The gate of amplifier transistor 308, as well as the feedback loop, is electrically connected to a storage region configured, for example, as a floating diffusion node 310. The feedback loop includes a capacitance element 320, a reset transistor 306, and a row select transistor 312. Capacitance element 320 may be a capacitor, a parasitic capacitance between an input node and an output node of the amplifier (i.e., between the drain and gate of amplifier transistor 308), or a combination of both.

In the feedback loop of circuit 300, reset transistor 306 is connected to the floating diffusion node 3 10. When row select transistor 312 is activated (during reset and amplification phases of the pixel circuit 300, as described below), reset transistor 306 is configured to short the input and output of the common-source amplifier when activated. Capacitance element 320 is also connected to floating diffusion node 310, and in parallel with reset transistor 306. When row select transistor 312 is activated and reset transistor 306 is deactivated (i.e., during amplification phase of the pixel circuit 300, as described below), capacitance element 320 is configured to act as a capacitive feedback loop and, along with a capacitance of photosensor 302, create a capacitance divider (described further below).

In pixel circuit 300, the row select transistor 312 is connected to the drain of amplifier transistor 308. Row select transistor 312 is configured to electrically connect the output of pixel circuit 300 to a column line and sample-and-hold circuit 660 (FIG. 6) when activated by row select signal RS. In the pixel circuit 300 shown in FIG. 3A, row select signal RS may be biased to a voltage sufficient to make row select transistor 312 act as a cascode buffer to increase the open loop gain of the in-pixel amplifier (i.e., the common-source amplifier formed by amplifier transistor 308, ground, and the feedback loop) of pixel circuit 300.

Pixel circuit 300 also includes a photosensor 302 and corresponding transfer transistor 304. Transfer transistor 304 is configured to electrically connect photosensor 302 with floating diffusion node 310 when activated. It should be understood, as discussed below with regard to FIG. 8, that embodiments of a pixel circuit with negative feedback control loop may include multiple pixels sharing common readout circuitry. Thus, while a single photosensor and corresponding transfer transistor is discussed for purposes of FIGS. 3A and 3B, the described embodiments are not so limited.

Figure 3B:
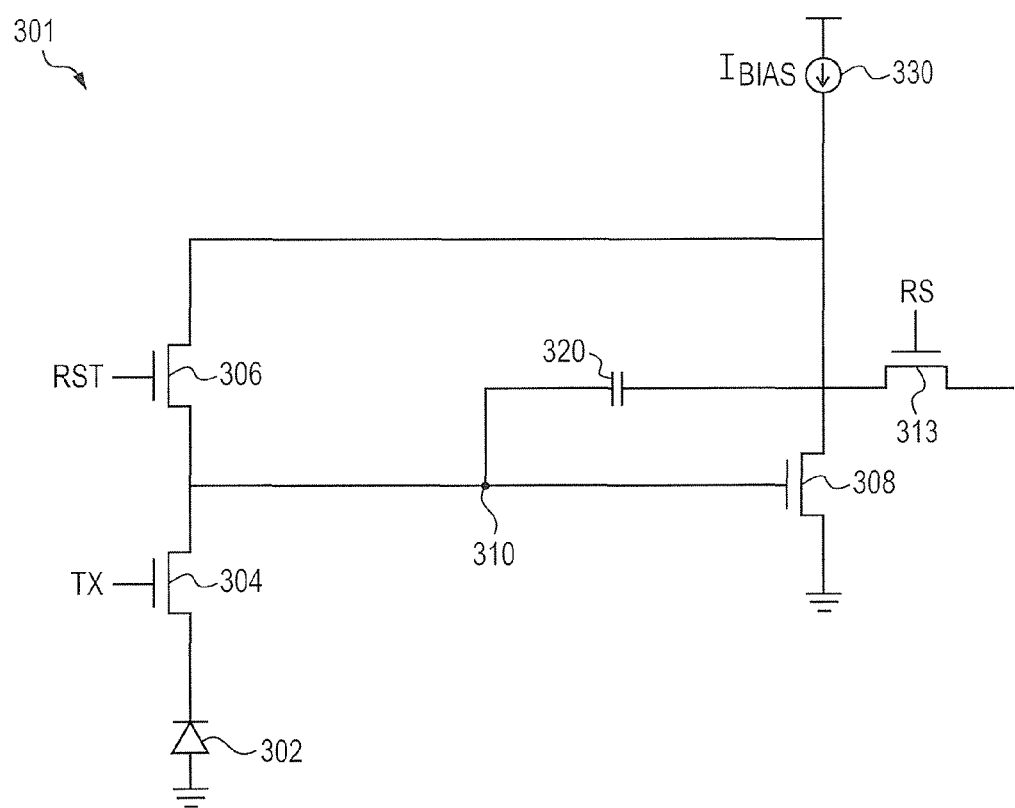
FIG. 3B shows a second embodiment of a pixel circuit with a negative feedback control loop, in accordance with embodiments described herein.

FIG. 3B illustrates a second example embodiment of a pixel circuit 301 having a negative feedback control loop. Elements of pixel circuit 301 correspond to like-numbered elements in pixel circuit 300 (FIG. 3A). In pixel circuit 301, row select transistor 313 is located outside of the feedback loop, and is connected to capacitance element 320 and the column line. It should be understood that, with row select transistor 313 located outside of the feedback loop of pixel circuit 301, row select transistor 313 does not need to be activated throughout the reset and amplification phases (discussed below), but only when voltage from pixel circuit 301 is actually sampled.

Figure 4:
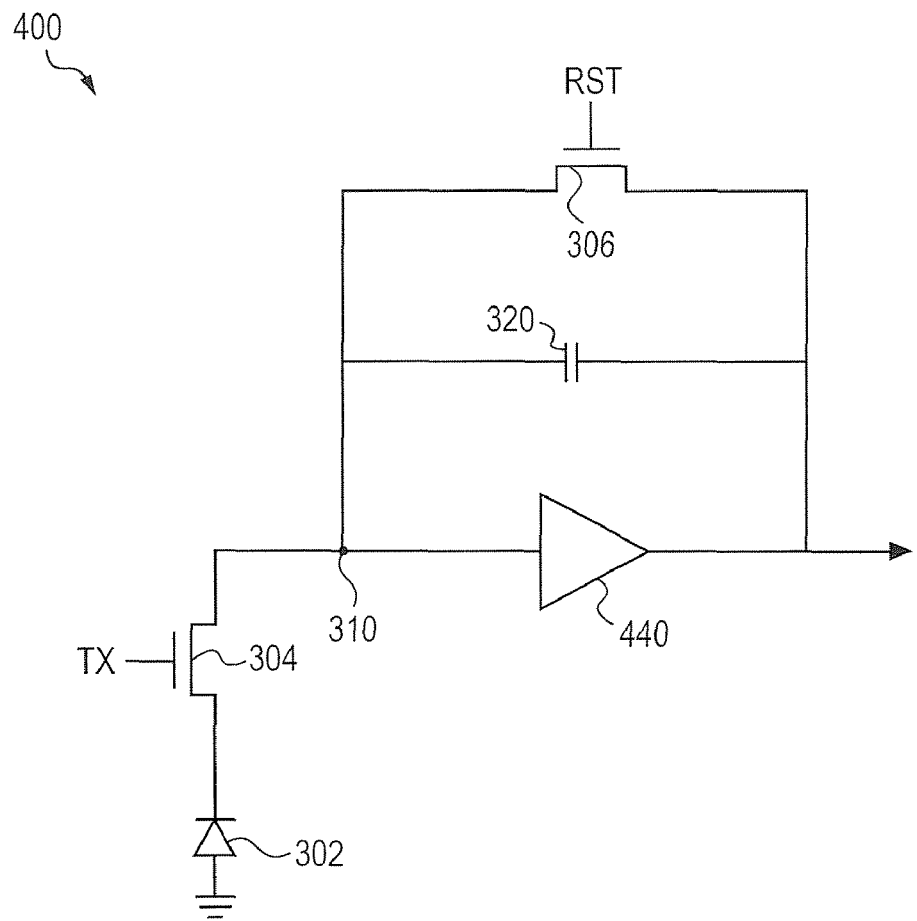
FIG. 4 shows a simplified schematic diagram of a pixel circuit with a negative feedback control loop, in accordance with embodiments described herein.

A simplified schematic diagram of a pixel circuit 400 with a negative feedback control loop, when the row select transistor is activated, is shown in FIG. 4. Pixel circuit 400 includes photosensor 302, transfer transistor 304, reset transistor 306, floating diffusion node 310, and capacitance element 320, as shown in pixel circuits 300 and 301 of FIGS. 3A and 3B. It should be understood that the location of the row select transistor (i.e., whether in the feedback loop as with row select transistor 312 of FIG. 3A, or outside of the feedback loop, as with row select transistor 313 of FIG. 3B) would not change the simplified diagram of pixel circuit 400, so long as row select transistor 312 of FIG. 3A and row select transistor 313 of FIG. 3B are on during reset and amplification phases of the pixel circuit 400. Reset transistor 306 is configured to connect the output and input of amplifier 440. Photosensor 302 is connected to floating diffusion node 310 via transfer transistor 304. Floating diffusion node 310 is connected to the input of an amplifier 440.

Amplifier 440 of FIG. 4, may, for example, comprise the common-source amplifier formed by amplifier transistor 308, ground, and bias current $I_{BIAS}$ 330, as shown in FIGS. 3A and 3B, or may include other types of amplifiers (i.e., any device that changes the amplitude of a voltage or current) and biasing elements configured to operate with feedback loops. Referring to pixel circuit 300 of FIG. 3A, amplifier 440 would also comprise the row select transistor 312 when row select transistor 312 is operated to provide a cascode amplifier (discussed below).

Figure 5:
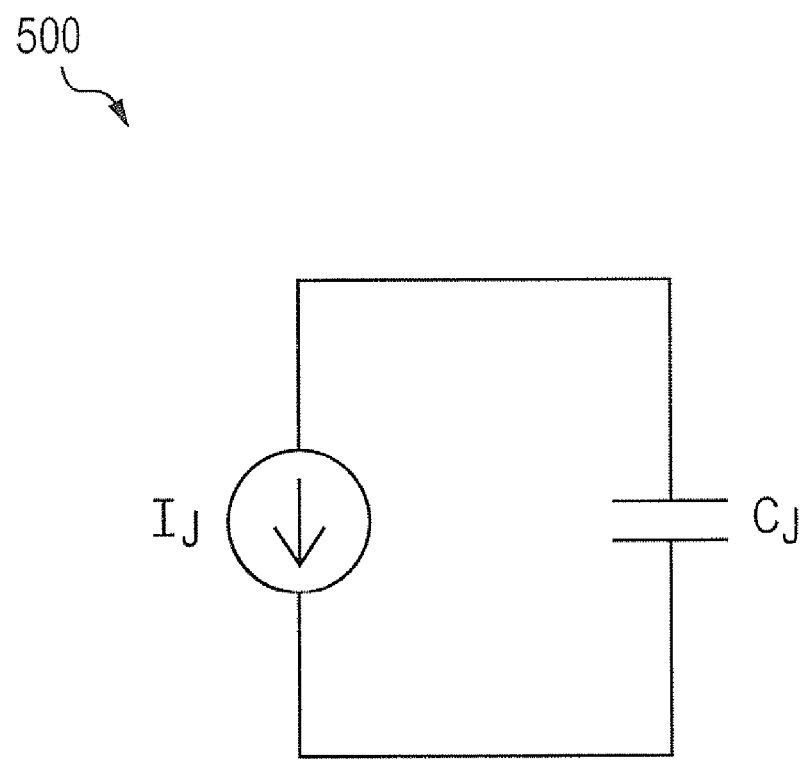
FIG. 5 shows a modeling of a pinned photodiode, such as may be used with embodiments described herein.

Photosensor 302 is, for example, a pinned photodiode, with a junction capacitance determined approximately by a pinned potential $V_{PIN}$ and photodiode capacity $C_{PD}$ of the photosensor 302. FIG. 5 shows a model 500 of a pinned photodiode. A pinned photodiode may be modeled as a junction capacitance $C_J$ and a junction reverse leakage current $I_J$. The junction reverse leakage current $I_J$ is proportional to the amount of light incident on the photodiode. The junction capacitance $C_J$ is a function of the pinned potential $V_{PIN}$ and photodiode capacity $C_{PD}$ of the photodiode. A typical value of junction capacitance $C_J$ may be, for example, approximately 50 femto-Farads. However, junction capacitance $C_J$ depends upon the pinned potential $V_{PIN}$ and photodiode capacity $C_{PD}$, which in turn depends upon pixel size, fill factor, and doping. Further, while a pinned photodiode is described above, other embodiments of a pixel circuit with a negative feedback control loop may include any type of photosensor, such as a photodiode, photogate, or other photosensitive element. Similar models of these and other photosensors are known in the art, and also include a capacitance value. Thus, embodiments disclosed herein may be implemented using photosensors with various capacitance values and properties, as are known in the art.

Referring back to FIG. 4, when reset transistor 306 is activated, the input and output of amplifier 440 are short-circuited via the feedback loop. This resets the voltage of photosensor 302 and floating diffusion node 310 to the gate-to-source voltage $V_{GS\_AMP}$ of amplifier transistor 308 at the drain current of $I_{BIAS}$ 330 (within amplifier 440). When reset transistor 306 is deactivated and transfer transistor 304 is activated, capacitance element 320 and junction capacitance $C_J$ (FIG. 5) of photosensor 302 form a capacitance divider. The feedback loop including capacitance element 320 acts as a negative feedback control loop—as the voltage at floating diffusion node 310 increases, the output of amplifier 440 decreases and the amplitude is amplified by an open-loop gain of amplifier 440. As a result, the voltage at floating diffusion node 310 remains at a fixed voltage (i.e., the gate-to-source voltage $V_{GS\_AMP}$ of amplifier transistor 308 at the drain current of $I_{BIAS}$ 330) due to the negative feedback control loop.

Photosensor 302 generates a voltage representing incident light received at photosensor 302. Thus, the voltage on photosensor 302 changes with incident light. As discussed above, however, although transfer transistor 304 is activated, the voltage at floating diffusion node 310 remains at a fixed voltage due to the negative feedback control loop. The difference between the voltage at photosensor 302 (changing due to incident light) and the voltage at floating diffusion node 310 (fixed by the negative feedback control loop) results in a net current of electrons transferred between photosensor 302 and floating diffusion node 310. The net current is input to amplifier 440, which acts as an operational transconductance amplifier (OTA), producing an output current from the difference in potential between photosensor 302 and floating diffusion node 310. This net current is then integrated and converted to a signal voltage at the output side of amplifier 440 at capacitance element 320. The voltage gain $A_V$ of circuit 400 is calculated according to Equation 1.

$$A_V = C_J/C_C,\qquad\text{Equation 1:}$$

where $C_J$ is the junction capacitance of photosensor 302, and $C_C$ is the capacitance of the capacitance element 320. The conversion gain $A_C$ of circuit 400, representing the conversion of charge received at photosensor 302 to voltage, is calculated according to Equation 2.

$$A_C = Q/C_C,\qquad\text{Equation 2:}$$

where Q represents the charge of a single electron e (i.e., $1.6\times10^{-19}$ Coulomb/e, where one Coulomb (C) is equal to 1 Farad times 1 Volt), as is known in the art, and the conversion gain $A_C$ is represented in microvolts per electron (uV/e).

The capacitance $C_C$ of capacitance element 320 can be made very small. For example, capacitance $C_C$ may be the parasitic capacitance between the output and input of amplifier 440 (i.e., between the gate and drain of amplifier transistor 308 in FIG. 3A), and may have a capacitance value in a range of 1 to 3 femtoFarads. A pixel circuit similar to those of pixel circuit 300 employing a capacitance element 320 with capacitance $C_C$ of 1 femtoFarad would have a conversion gain $A_C$ calculated according to Equation 3.

$$A_C = Q/C_C 1.6\times10^{-19}C/1.0\times10^{-15}F = 160\ \text{uV/e}.\qquad\text{Equation 3:}$$

Thus, the conversion gain $A_C$ can be made very high, and is no longer determined by the capacitance of floating diffusion node 310.

An increased conversion gain also results in reduced noise, such as readout noise. For example, readout noise has been shown to be reduced by a factor equivalent to the voltage gain $A_V = C_I/C_C$. Thus, along with the desired effect of a high conversion gain, a smaller capacitance $C_C$ of capacitance element 320 may be preferred to reduce noise in the pixel circuit. Smaller capacitance values, however, result in a higher likelihood of mismatch between pixel circuits in a pixel array. Therefore, the capacitance $C_C$ of capacitance element 320 can be chosen to balance the desire to minimize pixel circuit mismatch while providing desired conversion gain and noise reduction. A capacitance value in a range of 1 to 3 femtoFarads can provide high conversion gain and can typically be adequately matched in multiple pixel circuits. It should be understood that other embodiments may include any appropriate capacitance value of capacitance element 320.

Figure 6:
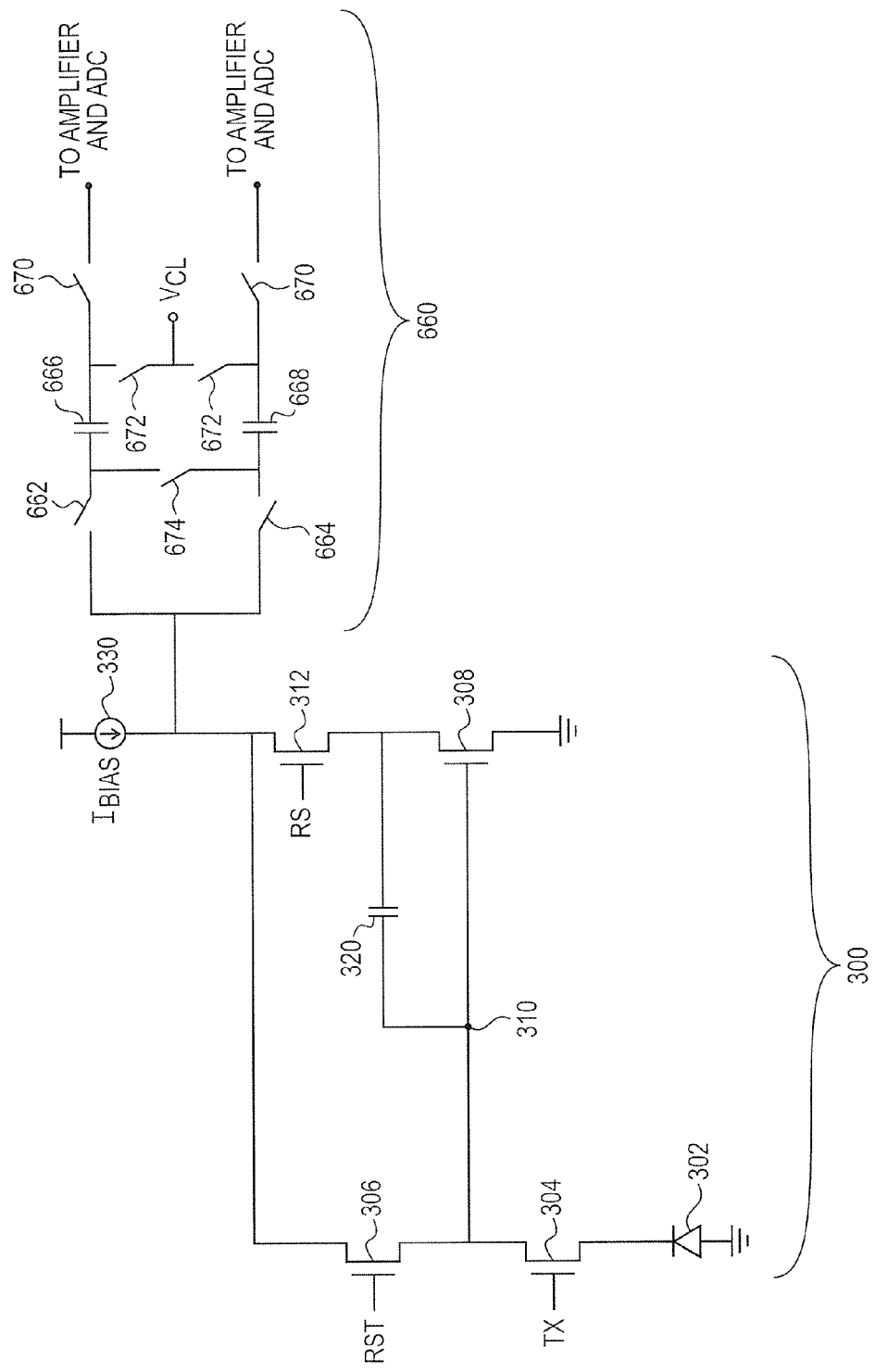
FIG. 6 shows a pixel circuit with a negative feedback control loop with corresponding sample-and-hold circuitry.
Figure 9:
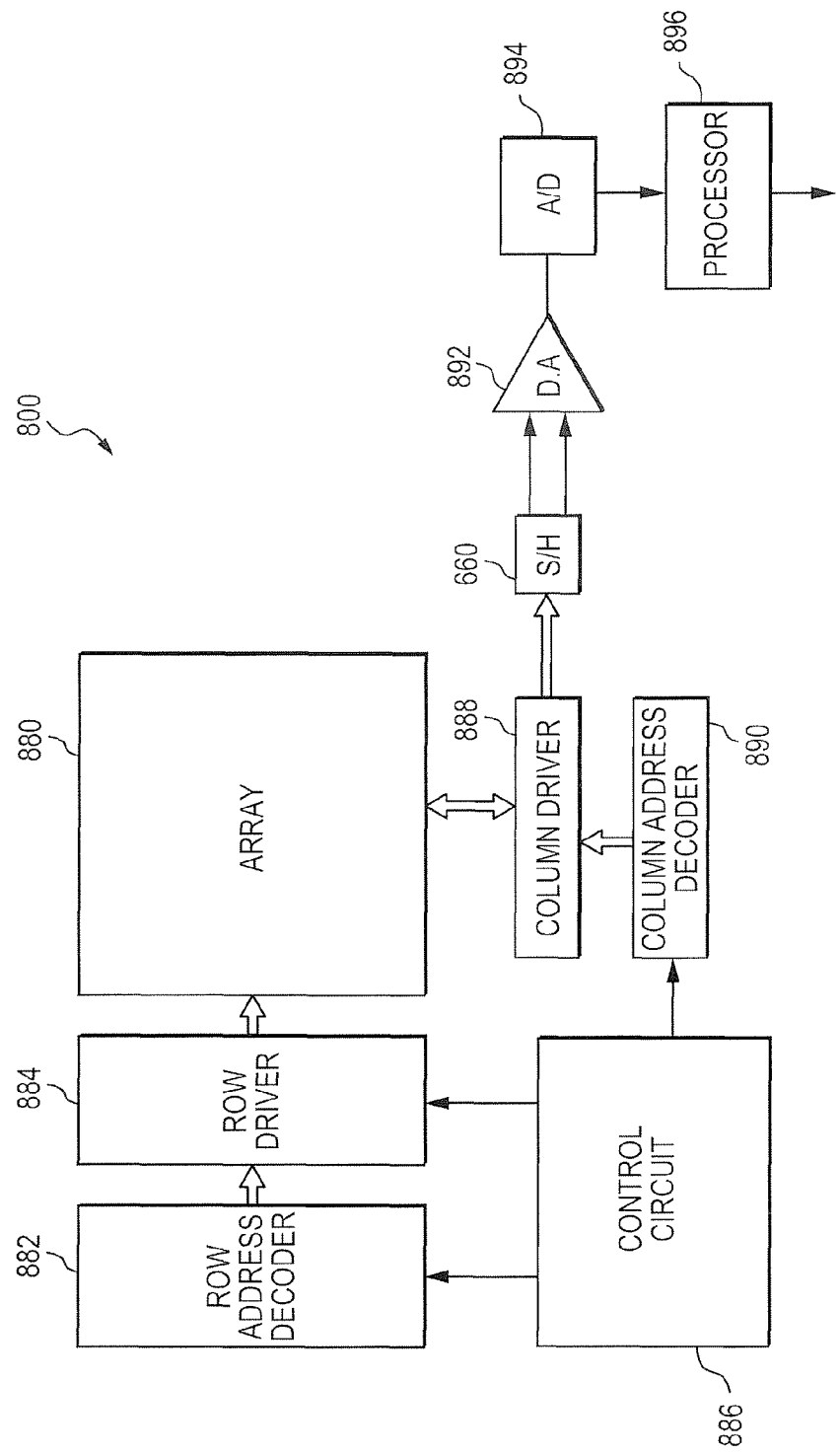
FIG. 9 shows an imager comprising a pixel circuit constructed according to embodiments described herein.

FIG. 6 shows the pixel circuit 300 with in-pixel amplifier of FIG. 3A, with corresponding sample-and-hold circuitry 660. Sample-and-hold circuitry 660 is configured to store reset and image signals from pixel circuit 300, and output these signals to a differential amplifier 892 and analog-to-digital converter 894 (FIG. 9).

Sample-and-hold circuitry 660 is electrically connected to the output of row select transistor 312 when row select transistor 312 is activated by row select signal RS. It should be understood that, while a single pixel circuit and corresponding sample-and-hold circuitry is shown in FIG. 6, a typical pixel array will include multiple pixel circuits, such as all pixel circuits in a column of the pixel array, connected to a single sample-and-hold circuitry via a column line. Each pixel circuit connected to common sample-and-hold circuitry may be selectively electrically connected to common sample-and-hold circuitry by respective row select transistors (such as row select transistor 312).

Sample-and-hold circuitry 660 includes a reset sample switch 662 controlled by reset sample-and-hold signal $SH_{RST}$ (FIG. 7), and a reset sample capacitor 666. Sample-and-hold circuitry 660 also includes a signal sample switch 664 controlled by signal sample-and-hold signal $SH_{SIG}$ (FIG. 7), and a signal sample capacitor 668. A crowbar switch is located between the inputs of reset sample capacitor 666 and signal sample capacitor 668 for forcing a charge present on the capacitors 666, 668 through the differential amplifier 892 (FIG. 9). Reset sample capacitor 666 and signal sample capacitor 668 are configured to store a reset voltage and signal voltage, respectively. Prior to readout, reset sample capacitor 666 and signal sample capacitor 668 are reset to a reference voltage $V_{CL}$ by closing and opening respective clamp switches 672. The stored reset voltage and signal voltage are output to differential amplifier 892 (FIG. 9) by closing respective output switches 670.

Figure 7:
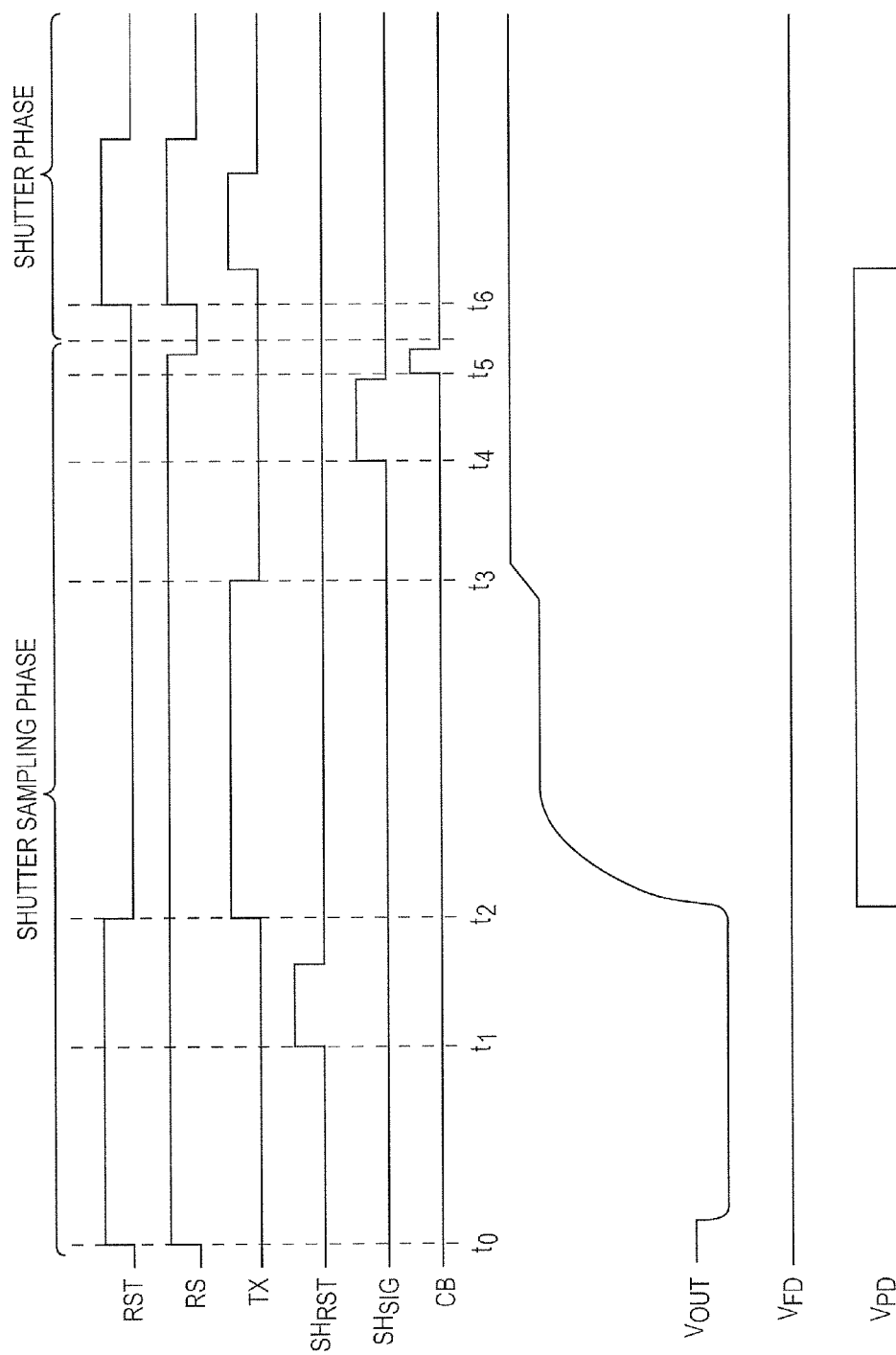
FIG. 7 shows a timing diagram illustrating a method of operation and corresponding output of a pixel circuit with a negative feedback control loop constructed in accordance with embodiments described herein.

FIG. 7 shows a timing diagram illustrating a method of operation and corresponding output of a pixel circuit with a negative feedback control loop constructed in accordance with embodiments described herein. The method of operation and corresponding output described herein are discussed with respect to pixel circuit 300 and corresponding sample-and-hold circuitry 660 shown in FIG. 6. However, embodiments of a pixel circuit with a negative feedback control loop are not limited to those shown in FIG. 6. For instance, the operation of pixel circuit 301 of FIG. 3B, along with the sample-and-hold circuitry 660 shown in FIG. 6, would be similar. Thus, the method of operation described herein refers to pixel circuit 300 and corresponding sample-and-hold circuitry 660 for example purposes only. Further, it should be understood that, while various events are described in a particular order, the method of operation is not so limited unless explicitly stated.

Embodiments of a pixel circuit having a negative feedback control loop described herein are configured to integrate charge during a shutter phase, and to sample pixel signals corresponding to the integrated charges during a pixel sampling phase. For purposes of embodiments described herein, unless otherwise stated, any appropriate configuration (such as a rolling shutter or global shutter phase) may be used to control the shutter phase.

Operation of the embodiments described herein during the pixel sampling phase includes two phases: a reset phase and an amplification phase. The reset phase corresponds approximately to times t0 through t1 of FIG. 7. The amplification phase corresponds approximately to times t2 through t5 of FIG. 7. Charge integration begins on photosensor 302 during a shutter phase. Because an integration period of photosensor 302 may have a longer duration than the readout time of pixel circuit 300, the shutter phase of photosensor 302 may begin well prior to the pixel sampling phase; for example, the shutter phase of photosensor 302 may begin during a pixel sampling phase of another row of pixels in the pixel array.

During the pixel sampling phase, at time t0, floating diffusion node 310 is reset. Reset transistor 306 and row select transistor 312 are activated by reset control signal RST and row select signal RS, respectively. It should be understood that, in embodiments with the row select transistor located outside of the feedback loop (such as with the row select transistor 313 of pixel circuit 301, shown in FIG. 3B), turning on the row select transistor at the initial time t0 would not be required. Rather, row select transistor 313 could be turned on by reset control signal RST immediately prior to sampling a voltage (i.e., immediately before sampling a reset voltage by activating reset sample-and-hold signal $SH_{RST}$).

Thus, the input and output of the amplifier (i.e., common-source amplifier formed by amplifier transistor 308 and ground in FIG. 3A) are short-circuited to one another. This resets floating diffusion node 310 to a gate-to-source voltage $V_{GS\_AMP}$ of amplifier transistor 308, and reduces noise between multiple pixel circuits of a pixel array caused by DC offset due to mismatched transistors. Gate-to-source voltage $V_{GS\_AMP}$ of amplifier transistor 308 is calculated according to Equation 4.

$$V_{GS\_AMP} = \sqrt{2u_n C_{ox} W_{AMP}/L_{AMP} I_{BIAS}} + V_{TH,N},$$

where $W_{AMP}$ and $L_{AMP}$ represent the width and length of amplifier transistor 308, both of which may typically be approximately 0.5 µm, $I_{BIAS}$ is the bias current 330, which may be within a range of approximately 5 to approximately 10 µA, and $V_{TH,n}$ is the threshold voltage of amplifier transistor 308, typically approximately 700 mV. At time t1, which may occur before, after, or concurrently with charge integration on photosensor 302, the reset voltage is sampled by activating reset sample switch 662 via reset sample-and-hold signal $SH_{RST}$, and storing the reset voltage on reset sample capacitor 666.

At time t2, reset transistor 306 is deactivated via reset control signal RST, and transfer transistor 304 is activated via transfer signal TX. It should be understood that, while these events are described as occurring substantially simultaneously, reset transistor 306 should be deactivated prior to activating transfer transistor 304 at time t2, in order to avoid resetting the voltage on photosensor 302 and thus discarding the accumulated charge.

Once reset transistor 306 is deactivated and transfer transistor 304 is activated at time t2, a negative feedback control loop is formed with capacitance element 320 between the output and input of the amplifier. As described above with regard to FIGS. 3 and 4, capacitance element 320 and the junction capacitance $C_J$ of photosensor 302 form a capacitance divider, and the floating diffusion voltage $V_{FD}$ at floating diffusion node 310 is fixed.

As the voltage of photosensor 302 increases (due to charge generated by incident light received during the integration period at photosensor 302), the potential difference between the increasing voltage $V_{PD}$ on photosensor 302 and the fixed voltage of floating diffusion node 310 results in a net current. The net current is integrated across amplifier 440 (FIG. 4) and converted to an output signal voltage $V_{OUT}$ at a right side plate of the capacitance element 320. At time t3, transfer transistor 304 is deactivated, and the current integration and conversion to voltage at capacitance element 320 is complete. At time t4, the signal voltage $V_{OUT}$ is sampled by activating signal sample switch 664 via signal sample-and-hold signal $SH_{SIG}$, and storing signal voltage $V_{OUT}$ on signal sample capacitor 668. In order to read out the stored reset voltage and signal voltage $V_{OUT}$ from capacitors 666, 668, at time t5 a pulse signal CB is applied closing crowbar switch 674 (FIG. 6) and respective output switches 670, thereby forcing reset voltage and signal voltage $V_{OUT}$ on respective capacitors 666, 668 into differential amplifier 892 (FIG. 9).

As discussed above, the shutter phase operation of embodiments described herein may occur according to any appropriate configuration (such as a rolling shutter or global shutter phase). In a further embodiment, photosensor 302 may optionally also be reset during the shutter phase. At time t6 in FIG. 7, the photosensor reset operation is shown at the commencement of a subsequent shutter phase, i.e., prior to the subsequent pixel sampling phase. Photosensor 302 may be reset in either global shutter or rolling shutter timing by activating transfer transistor 304 via transfer control signal TX, row select transistor 312 via row select line RS (if row select transistor 312 is in the feedback loop), and reset transistor 306 via reset signal RST, as shown in FIG. 7 at time t6. This resets the voltage on photosensor 302 to the gate-to-source voltage $V_{GS\_AMP}$ of amplifier transistor 308 at the drain current of $I_{BIAS}$ 330, as discussed above with regard to the reset voltage of the floating diffusion node 310.

As described above, with floating diffusion node 310 (FIG. 3A) set to a fixed voltage by the negative feedback control loop, transfer transistor 302 merely acts as a switch during the amplification phase of pixel circuit 300, triggering the transfer of the net current generated by the potential difference between photosensor 302 and floating diffusion node 310 to the input of amplifier 440 (FIG. 4). This transfer of net current does not rely on perfect charge transfer (e.g., via transfer transistor 304 of FIG. 3A) from photosensor 302 to floating diffusion node 310. Thus, an increased full-well charge capacity of photosensor 302 does not result in charge remaining in photosensor 302 after the amplification phase. Further, photosensor 302 may be reset during each shutter phase, as described above. Thus, image lag in pixel arrays having photosensors with high full-well capacity is reduced or eliminated by pixel circuit 300.

Figure 8:
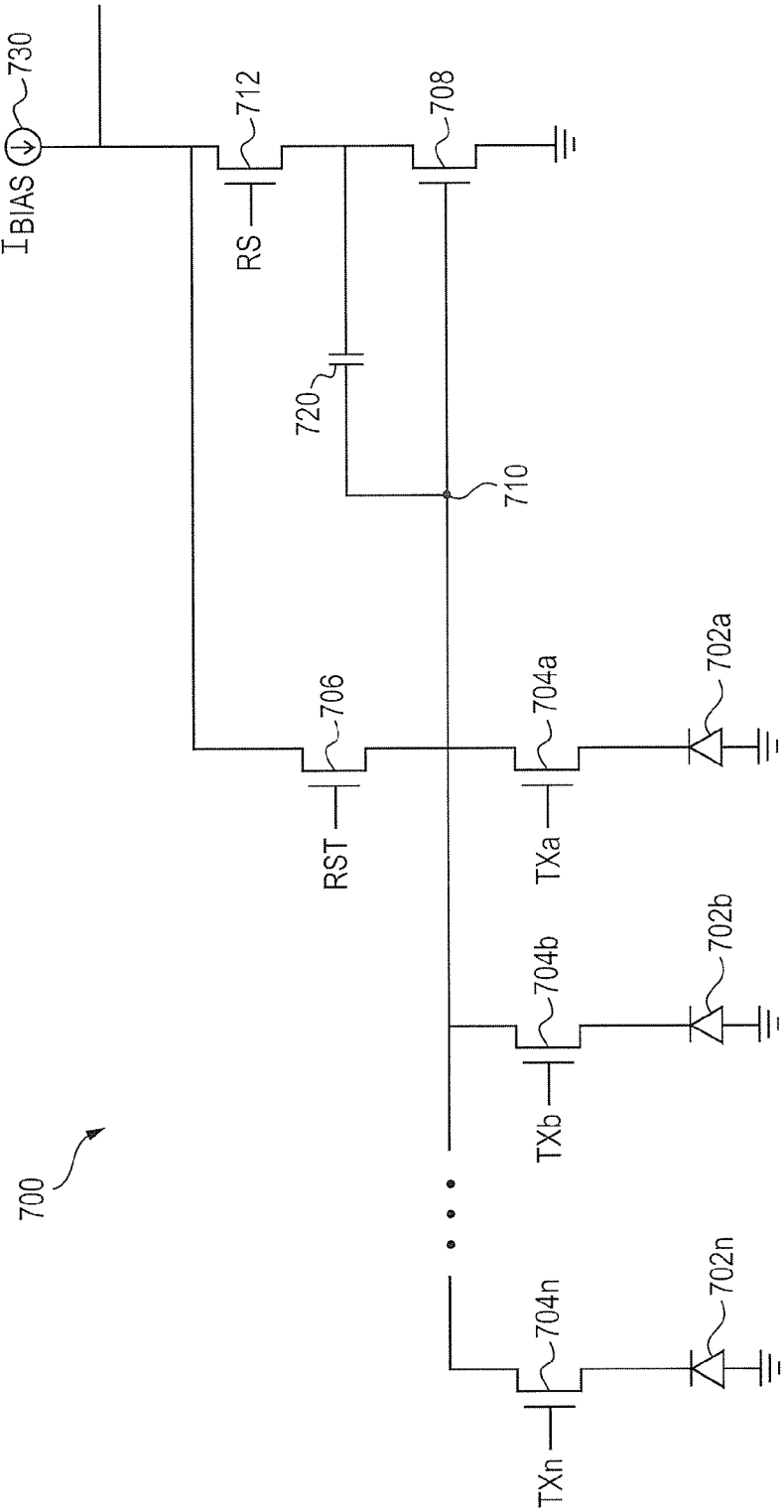
FIG. 8 shows a pixel circuit including multiple pixels sharing readout circuitry with a negative feedback control loop constructed in accordance with further embodiments described herein.

FIG. 8 shows a pixel circuit 700 including multiple photosensors 702a, 702b, through 702n, sharing readout circuitry having a negative feedback control loop similar to that described in FIGS. 3A and 3B. Pixel circuit 700 includes a reset transistor 706, floating diffusion node 710, amplifier transistor 708, row select transistor 712, capacitance element 720, and bias current 730. Photosensors 702a, 702b, through 702n are selectively electrically connected to floating diffusion node 710 via respective transfer transistors 704a, 704b, through 704n controlled by respective transfer control signals TXa, TXb, through TXn.

Photosensors 702a, 702b, through 702n sharing readout circuitry of pixel circuit 700 may comprise four photosensors, eight photosensors, or any other number of photosensors in the same pixel array. One or more of photosensors 702a, 702b, through 702n may be in the same column or row of pixels in a pixel array. If in the same row, respective transfer control signals TXa, TXb, through TXn may be used to keep separate the transfer of charge from photosensors to the floating diffusion node 710.

Because floating diffusion node 710 maintains a fixed voltage during the amplification phase due to the negative feedback control loop, net current from photosensors 702a, 702b, through 702n may be transferred to floating diffusion node 710 simultaneously (for instance, implementing pixel summing when all transfer control signals TXa, TXb, through TXn are turned on together) without concern for the capacity of floating diffusion node 710. Alternatively, net current from photosensors 702a, 702b, through 702n may be transferred to floating diffusion node 710 at different times, providing for individual readout of photosensors 702a, 702b, through 702n without readout circuitry for each photosensor. For example, net current from photosensors 702a, 702b, through 702n may be transferred to floating diffusion node 710 sequentially by sequentially activating transfer control signals TXa, TXb, through TXn. Further, because transfer transistors 704a, 704b, through 704n act as switches during transfer of charge from their respective photosensors 702a, 702b, through 702n, the individual transfer efficiency of respective transfer transistors 704a, 704b, through 704n does not limit operation of pixel circuit 700. Furthermore, pixel-sharing does not degrade the conversion gain of pixels in pixel circuit 700.

Embodiments of a pixel circuit having a negative feedback control loop and associated methods of operation described above may be implemented as part of an imager. FIG. 9 illustrates a block diagram of a CMOS imager 800 having a pixel array 880 including a plurality of pixels arranged in a predetermined number of columns and rows. Pixel array 880 includes at least one of the embodiments of a pixel circuit having a negative feedback control loop described above. Pixel values of pixel array 880 are output row-by-row as activated by the control signals from row driver 884 in response to a row address decoder 882. Column driver 888 and column address decoder 890 are also used to selectively activate individual pixel columns. An imager control circuit 886 controls the address decoders 882, 890 for selecting the appropriate row and column lines for pixel value readout. The control circuit 886 also controls the row and column driver circuitry 884, 888 such that driving voltages may be applied. For the at least one pixel circuit 300 (FIG. 3A) of pixel array 880, control circuit 886 may also provide a transfer signal TX to transfer transistor 304, a reset control signal RST to reset transistor 306, and/or a row select signal RS to row select transistor 312.

Pixel circuits of pixel array 880 each output both a reset signal $V_{RST}$ and an image signal $V_{OUT}$, which are sampled, held and amplified by a sample and hold circuit 660 as described with regard to FIGS. 6 and 7. The difference $V_{OPIX\_DIFF} = (V_{RST} - V_{OUT})$ between $V_{RST}$ and $V_{OUT}$ represents the actual pixel output with common-mode noise eliminated. The differential signal $V_{OPIX\_DIFF}$ is produced by differential amplifier 892 for each voltage read out from pixel array 880. The differential signals are digitized by an analog-to-digital converter 894. The analog-to-digital converter 894 supplies the digitized pixel signals to an image processor 896, which forms and outputs a digital image.

Imager 800 and associated methods of use described above may be used in any system that employs a CMOS imager device, including, but not limited to a computer system, camera system, scanner, machine vision, vehicle navigation, video telephone, surveillance system, automatic focus system, star tracker system, motion detection system, image stabilization system, and other imaging systems. Example digital camera systems in which the above embodiments may be used include both still and video digital cameras, cellular telephone cameras, handheld personal digital assistant (PDA) cameras, and other types of cameras.

Figure 10:
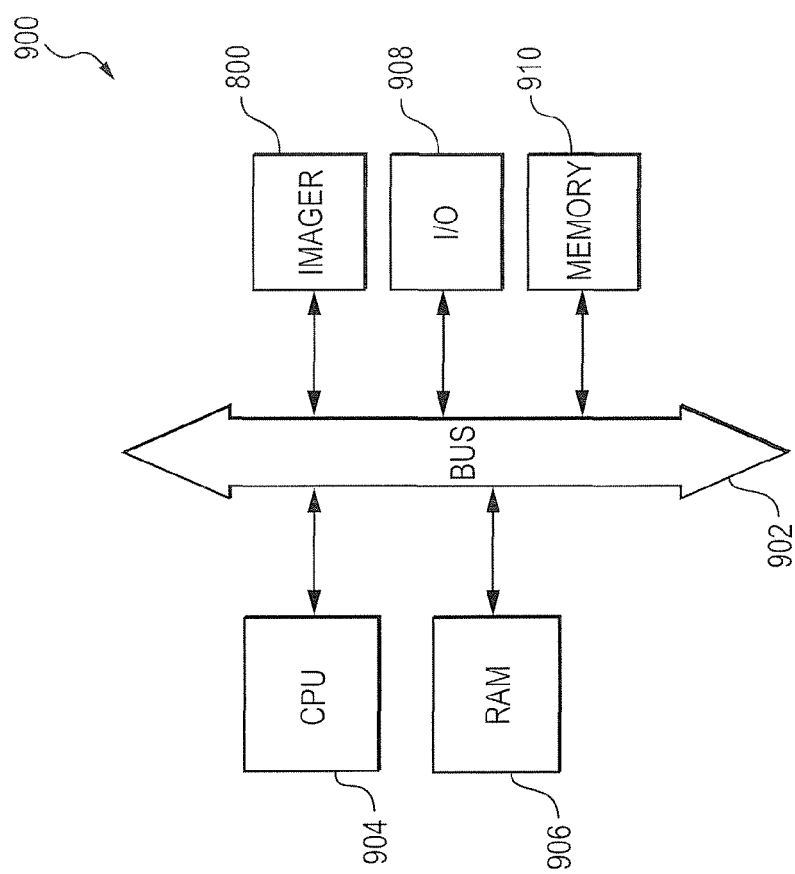
FIG. 10 shows a camera device having a pixel circuit constructed in accordance with embodiments described herein.

FIG. 10 shows a typical imager system 900. System 900 includes imager 800, which includes a pixel array 880 (FIG. 8) having at least one pixel circuit with a negative feedback control loop, constructed in accordance with embodiments described herein. System 900 generally comprises a processing unit 904, such as a microprocessor, that controls system functions and which communicates with an input/output (I/O) device 908 over a bus 902. Imager 900 also communicates with the processing unit 904 over the bus 902. System 900 also includes random access memory (RAM) 906, and can include removable memory 910, such as flash memory, which also communicates with the processing unit 904 via the bus 902.

Example embodiments of methods, systems, and components thereof have been described herein. As noted elsewhere, these example embodiments have been described for illustrative purposes only, and are not limiting. The breadth and scope of the present invention should not be limited by any of the above described exemplary embodiments, but should be defined only in accordance with the following claims and their equivalents.

The invention claimed is:

1. A pixel circuit comprising:
at least one pixel including a photosensor and a transfer transistor;
a charge storage node configured to be electrically connected to said photosensor when said transfer transistor is activated;
an amplifier having an input node and an output node, the input node electrically connected to said charge storage node; and
a feedback loop electrically connected between said input node and said output node of said amplifier, said feedback loop comprising a capacitance element and a reset transistor electrically connected in parallel to said capacitance element during operation of said pixel, wherein said reset transistor is configured to receive a reset control signal and said transfer transistor is configured to receive a transfer control signal from a control circuit, and wherein said control circuit is configured to deactivate said reset transistor and activate said transfer transistor to form a capacitance divider between said capacitance element and said photosensor.

2. The pixel circuit of claim 1, wherein said capacitance divider fixes a voltage of said charge storage node at a substantially constant voltage.

3. A pixel circuit comprising:
at least one pixel including a photosensor and a transfer transistor;
a charge storage node configured to be electrically connected to said photosensor when said transfer transistor is activated;
an amplifier having an input node and an output node, the input node electrically connected to said charge storage node;
a capacitive element electrically connected between said input node and said output node of said amplifier; and
a reset transistor electrically connected in parallel to said capacitance element, wherein, during an integration period of said pixel, said capacitive element and said reset transistor form a negative feedback control loop with said amplifier that fixes a voltage on said charge storage node, wherein said amplifier is a common-source amplifier comprising a transistor with a gate electrically connected to said charge storage node, and a drain connected to a column current sink and said negative feedback control loop.

4. The pixel circuit of claim 3, further comprising a row select transistor configured to receive a row select control signal and electrically connect said capacitance element to an output column line.

5. The pixel circuit of claim 4, wherein said row select transistor is connected within said negative feedback control loop between said drain and said reset transistor.

6. The pixel circuit of claim 5, wherein said row select control voltage is biased at a voltage level sufficient to operate said row select transistor as a cascode buffer for said amplifier.

7. The pixel circuit of claim 4, wherein said row select transistor is connected outside said negative feedback control loop to said drain and said column line.

8. The pixel circuit of claim 3, wherein said amplifier is biased by said current sink.

9. The pixel circuit of claim 3, wherein said capacitance element is a capacitor.

10. The pixel circuit of claim 3, wherein said capacitance element is a parasitic capacitance between said input node and said output node of said amplifier.

11. The pixel circuit of claim 3, wherein said capacitance element is a parasitic capacitance between said drain and said gate of said common-source amplifier.

12. The pixel circuit of claim 3, wherein said capacitance element has a capacitance within a range of approximately 1 femtoFarad to approximately 3 femtoFarads.

13. A pixel circuit comprising:
at least one pixel including a photosensor and a transfer transistor;
a charge storage node configured to be electrically connected to said photosensor when said transfer transistor is activated;
an amplifier having an input node and an output node, the input node electrically connected to said charge storage node; and
a feedback loop electrically connected between said input node and said output node of said amplifier, said feedback loop comprising a capacitance element and a reset transistor electrically connected in parallel to said capacitance element during operation of said pixel, wherein said amplifier comprises a common source amplifier comprising a transistor with a gate connected to said charge storage node, a source connected to a ground potential, and a drain connected to said capacitance element, wherein said common source amplifier is biased by a current sink, said pixel circuit further comprising a row select transistor electrically connected in said feedback loop between said capacitance element and said reset transistor, and wherein a control circuit is configured to deactivate said reset transistor and activate said transfer transistor to form a capacitance divider between said capacitance element and said photosensor.

14. A method of operating a pixel cell having a pixel circuit, said method comprising:
resetting said pixel circuit by activating a reset transistor of said pixel circuit, said pixel circuit further comprising at least one photosensor, a charge storage node, an amplifier having an input connected to said charge storage node, and a capacitance element in a feedback loop of said amplifier; and
amplifying a pixel signal of said pixel circuit by:
deactivating said reset transistor,
electrically connecting said at least one photosensor to said capacitance element and said floating diffusion node by activating said transfer transistor to form a capacitance divider between said at least one photosensor and said capacitance element, and
amplifying a signal provided at an input of said amplifier to produce a pixel signal.

15. The method of claim 14, wherein said signal provided at said input of said amplifier is a net current generated by a potential difference between said floating diffusion node and said photosensor, and
wherein amplifying said signal to produce said pixel signal further comprises integrating said net current at said capacitance element.

16. The method of claim 14, further comprising activating said reset transistor and said transfer transistor to reset said photosensor during a shutter phase.

17. The method of claim 14, further comprising activating a row select transistor electrically connecting an output of said amplifier to said reset transistor and to sample-and-hold circuitry prior to activating said reset transistor.

18. The method of claim 17, further comprising biasing a control signal of said row select transistor such that said row select transistor acts as a cascode amplifier to said amplifier.

19. An imager comprising:
a pixel array having a plurality of pixels, each of said pixels including at least one pair of a transfer transistor and a photosensor, said pixel array comprising:
a circuit configured to output a pixel signal from at least one of said pixels, said circuit comprising:
a charge storage node connected to said transfer transistor of said pixel;
an amplifier having an input node and an output node, wherein the input node is electrically connected to said charge storage node;
a capacitive element electrically connected between said input node and said output node of said amplifier; and
a reset transistor electrically connected in parallel to said capacitance element, wherein, during an integration period of said pixel, said capacitive element and said reset transistor form a negative feedback control loop with said amplifier that fixes a voltage on said charge storage node, wherein said amplifier is a common-source amplifier comprising a transistor with a gate electrically connected to said charge storage node, and a drain connected to a column current sink and said negative feedback control loop; and
sample-and-hold circuitry for sampling a reset voltage and an output voltage from said circuit.

20. The imager of claim 19, wherein said circuit further comprises a row select transistor configured to receive a row select control voltage and output a voltage from said circuit to said sample-and-hold circuitry.

21. An imager comprising:
a pixel array having a plurality of pixels, each of said pixels including at least one pair of a transfer transistor and a photosensor, said pixel array comprising:
a circuit configured to output a pixel signal from at least one of said pixels, said circuit comprising:
a charge storage node connected to said transfer transistor of said pixel;
an amplifier having an input node and an output node, wherein the input node is electrically connected to said charge storage node; and
a feedback loop electrically connected between said input node and said output node of said amplifier, said feedback loop comprising a capacitance element and a reset transistor electrically connected in parallel to said capacitance element during operation of said pixel;
sample-and-hold circuitry for sampling a reset voltage and an output voltage from said circuit; and
a control circuit configured to deactivate said reset transistor and activate at least one transfer transistor to form a capacitance divider between said capacitance element and said photosensor corresponding to said at least one activated transfer transistor.

22. The imager of claim 21, wherein said circuit is configured to output pixel signals from a plurality of pixels in said pixel array to said sample-and-hold circuitry via a column line.

23. The imager of claim 22, wherein said control circuit is configured to activate transfer transistors of each of said plurality of pixels substantially simultaneously.

24. The imager of claim 22, wherein said control circuit is configured to activate transfer transistors of each of said plurality of pixels at different times.

25. The imager of claim 21, wherein said row select transistor is located within said negative feedback control loop, and said row select control voltage is biased at a voltage level sufficient to operate said row select transistor as a cascode buffer for said amplifier.

26. The imager of claim 20, wherein said row select transistor is located outside of said negative feedback control loop.

27. The imager of claim 19, wherein said imager is part of a camera system.

* * * * *